United States Patent
Dooper et al.

(10) Patent No.: US 7,961,020 B2
(45) Date of Patent: Jun. 14, 2011

(54) DIGITAL SIGNAL CONVERTER

(75) Inventors: Lusten L. A. H. Dooper, Brummen (NL); Arnaud A. P. Biallais, Douvres la Delivrande (FR)

(73) Assignee: NXP B.V., Eindhoven (NL)

( * ) Notice: Subject to any disclaimer, the term of this patent is extended or adjusted under 35 U.S.C. 154(b) by 303 days.

(21) Appl. No.: 12/293,816

(22) PCT Filed: Mar. 27, 2007

(86) PCT No.: PCT/IB2007/051073
§ 371 (c)(1),
(2), (4) Date: Sep. 20, 2008

(87) PCT Pub. No.: WO2007/113736
PCT Pub. Date: Oct. 11, 2007

(65) Prior Publication Data
US 2010/0289546 A1    Nov. 18, 2010

(30) Foreign Application Priority Data

Mar. 31, 2006   (EP) .................................... 06112124
Mar. 27, 2007   (WO) .................. PCT/IB2007/051073

(51) Int. Cl.
*H03K 3/017* (2006.01)
*H03K 5/04* (2006.01)
*H03K 7/08* (2006.01)

(52) U.S. Cl. ......................... 327/172; 327/173; 327/174

(58) Field of Classification Search .................. 327/172, 327/173, 174
See application file for complete search history.

(56) References Cited

U.S. PATENT DOCUMENTS

| 5,559,467 | A | 9/1996 | Smedley |
| 6,522,278 | B1 | 2/2003 | Rhode et al. |
| 6,538,590 | B1 | 3/2003 | Gaboriau et al. |
| 2005/0099226 | A1 | 5/2005 | Risbo et al. |
| 2006/0001467 | A1* | 1/2006 | Fujino et al. .................. 327/172 |
| 2007/0279101 | A1 | 12/2007 | Onodera et al. |

FOREIGN PATENT DOCUMENTS

| JP | 1-151316 A | 6/1989 |
| JP | 5-244010 A | 9/1993 |
| WO | 0054403 A | 9/2000 |
| WO | 2005/104349 A1 | 11/2005 |

OTHER PUBLICATIONS

Nielsen K; "A Review and Comparison of Pulse Width Modulation (PWM) Methods for Analog and Digital Input Switching Power Amplifiers". 102 AES Convention, Mar. 1997, Munich, Germany.
Nielsen K; "PEDEC—A Novel Pulse Referenced Control Method for High Quality Digital PWM Switching Power Amplification". Power Electronics Specialists Conference, 1998. PESC 98 Record. 29th Annual IEEE, Fukuoka, Japan, May 17-22, 1998, New York, NY, USA, IEEE, US. vol. 1, pp. 200-207.

* cited by examiner

*Primary Examiner* — Lincoln Donovan
*Assistant Examiner* — John W Poos

(57) ABSTRACT

A digital signal converter (CNV) converts a digital input signal (PCM) into a pulse width modulated signal (PWM), which is a binary signal that comprises pulses of varying width. The digital signal converter can operate in a signal mode and a transition mode. In the transition mode, the digital converter provides the pulse width modulated signal (PWM) by applying an anti-transient noise shaping function (NSH2) to a direct current modification signal (SC). In the signal mode, the digital signal converter provides the pulse width modulated signal by applying a signal noise shaping function (NSH1) to the digital input signal.

16 Claims, 4 Drawing Sheets

DIGITAL SIGNAL CONVERTER

FIELD OF THE INVENTION

An aspect of the invention relates to a digital signal converter that converts a digital input signal into a pulse width modulated signal, which is a binary signal that comprises pulses of varying width. The digital input signal may be, for example, a pulse code modulated signal that represents audio information. The digital signal converter may be implemented in the form of, for example, an integrated circuit. Other aspects of the invention relate to a switching amplifier, a digital audio system, a method of converting a digital input signal into a pulse width modulated signal, and a computer program product for a programmable processor.

BACKGROUND OF THE INVENTION

A digital signal converter may form part of, for example, a switching amplifier that comprises a power output stage. The power output stage provides a power signal, which is an amplified version of the pulse width modulated signal. The power output stage may comprise, for example, two output transistors, one of which coupled between an output node of the switching amplifier and a supply voltage node on which a supply voltage is present. The other output transistor is coupled between the output node and signal ground. The one output transistor constitutes an open switch and the other output transistor constitutes a closed switch, or vice versa, depending on whether the pulse width modulated signal has a high value or a low value. Switching amplifiers are often referred to as class D amplifiers. Such amplifiers are power efficient and allow low distortion.

The pulse width modulated signal, which the digital signal converter provides, comprises a direct current component, which is typically a center value between the high value and the low value that the pulse width modulated signal may have. As a result, the power signal, which the switching amplifier provides, also comprises a direct current component, which is approximately half the supply voltage. So-called single-ended amplifier configurations require a direct current (DC) blocking capacitance in order to prevent the direct current component from reaching a load circuit for which the power signal is intended. In an audio application, the load circuit may be, for example, a loudspeaker or headphone.

Transient noise may occur when the switching amplifier is switched on or off. This is related to the direct current component in the pulse width modulated signal, which the digital signal converter provides. The direct current component causes a charging or a discharging of the DC blocking capacitance when the switching amplifier is switched on or off, respectively. This charging or discharging may cause transient noise. In an audio application, the transient noise may be in the form of, for example, an audible plop or click sound.

Transient noise may be suppressed by charging and discharging a DC blocking capacitance in a smooth manner. There are various manners of smoothly charging and discharging the DC blocking capacitance, one of which is as follows. A direct current modification signal is applied to the digital signal converter, which causes the pulse width modulated signal to comprise a sequence of pulses that smoothly charges or discharges the DC blocking capacitance, whichever is required. The direct current modification signal may be in the form of, for example, a so-called ramp, which has a start point or an end point that corresponds with signal ground.

However, a stability problem may occur when the DC blocking capacitance is charged or discharged by means of a direct current modification signal that is applied to the digital signal converter. A digital signal converter typically comprises a so-called noise shaper, which pushes noise, as it were, to a spectral region that is a relatively distant from a desired spectral region, which is associated with the digital input signal. A noise shaper is typically unstable when the noise shaper receives a digital input signal that has a minimum value or a maximum value. The minimum value may correspond with, for example, signal ground in a single-ended implementation. Consequently, a direct current modification signal that has signal ground as a start point or an end point will cause the noise shaper to become unstable. The noise shaper will then produce a noisy output signal, which will be present in the power signal of the switching amplifier.

U.S. Pat. No. 6,538,590 describes a system for suppressing transient noise in switched-mode amplifier systems. In this system, a switched-mode power amplifier comprises a complementary pair of metal oxide semiconductor field effect transistors (MOSFETs), which constitutes an amplifier switch. An additional pair of MOSFETs is provided. A common node of these MOSFETs is coupled to an output node through a resistor. The additional pair of MOSFETs is configured to drive a ramp on the output node.

SUMMARY OF THE INVENTION

It is an object of the invention to prevent transition noise in a cost-efficient manner. The independent claims define various aspects of the invention. The dependent claims define additional features for implementing the invention to advantage.

The invention takes the following points into consideration. A noise shaper is a feedback system that has a nonlinear closed loop response. A noise shaper therefore provides a transfer characteristic and has a stability margin that depends on characteristics of an input signal, which the noise shaper receives. For example, a noise shaper may provide a satisfactory transfer characteristic in terms of noise and distortion for a particular type of input signal, such as, for example, a digital audio signal. This noise shaper may indeed be unstable for another type of input signal, such as, for example, a direct current modification signal. However, it is possible to modify the noise shaper so that the stability margin is sufficient for this other type of input signal. On the other hand, the thus modified noise shaper may then no longer provide a satisfactory transfer characteristic for the first mentioned type of input signal.

In accordance with the invention, a digital signal converter, which converts a digital input signal into a pulse width modulated signal, has the following characteristics. The digital signal converter can operate in a transition mode and a signal mode. In the transition mode, the digital converter provides the pulse width modulated signal by applying an anti-transient noise shaping function to a direct current modification signal. In the signal mode, the digital signal converter provides the pulse width modulated signal by applying a signal noise shaping function to the digital input signal.

Accordingly, the invention allows optimizing the signal noise shaping function with regard to the digital input signal in terms of noise and distortion, on the one hand, and optimizing the anti-transient noise shaping function with regard to the direct current modification signal in terms of stability, on the other hand. Separate noise shaping filters may provide the aforementioned noise shaping functions. Alternatively, a single reconfigurable noise shaping filter may provide the signal noise shaping function as well as the anti-transient shaping function. In either case, the noise shaping functions can be implemented at moderate cost in, for example, an integrated circuit. A separate anti-transient noise shaping filter can be implemented on a relatively small integrated circuit area. In contrast, the system described in the aforementioned US patent requires additional MOSFETs and a resistor, which will generally be more expensive. For those reasons, the invention allows cost-efficient suppression of transient noise.

What is more, the invention allows better suppression of transient noise compared with the system described in the aforementioned U.S. patent. This system relies on attenuation of transition noise by means of the resistor that is coupled between the common node of the additional MOSFETs and the output node. The system may indeed suppress the transient noise but does not effectively prevent the transient noise from occurring. In contrast, the invention allows the digital signal converter to provide a sequence of pulses, which smoothly charges or discharges a DC blocking capacitance, without any transient noise. This is because the invention prevents transient noise, which would otherwise occur due to noise shaper instability. For those reasons, the invention allows relatively good transient noise suppression.

An implementation of the invention advantageously comprises one or more of the following additional features, each of which contributes to preventing transient noise in a cost-efficient manner. Different sets of additional features, which correspond with different dependent claims, are presented as different paragraphs.

The signal noise shaping function preferably forms part of a signal conversion path, which further comprises a switch and a square wave generator with variable duty cycle. The switch passes output samples from the signal noise shaping function to the square wave generator in the signal mode, and passes output samples from the anti-transient noise shaping function in the transition mode.

The digital signal converter preferably comprises a transient curve generator that provides the direct current modification signal in the form of a startup curve, which causes the pulse width modulated signal to comprise a sequence of positive pulses of gradually increasing width.

The digital signal converter preferably comprises a transient curve generator that provides the direct current modification signal in the form of a shutdown curve, which causes the pulse width modulated signal to comprise a sequence of positive pulses of gradually decreasing width.

The direct current modification signal is preferably in the form of a curve, which has a first derivative that is substantially equal to zero in a start portion and in an end portion of the curve.

The transient curve generator preferably comprises an interpolator for providing interpolated samples between respective samples, which are read from a memory.

The digital signal converter preferably comprises a noise shaping filter, which provides the anti-transient noise shaping function. The noise shaping filter comprising various clipping integrators with respective clipping values. A clipping integrator providing output samples whose respective magnitudes are clipped to the clipping value of the clipping integrator.

The clipping value of one clipping integrator is preferably at least in order of magnitude lower than the clipping value of another clipping integrator.

A detailed description with reference to drawings illustrates the invention summarized hereinbefore, as well as the additional features.

DETAILED DESCRIPTION

Figure 1:
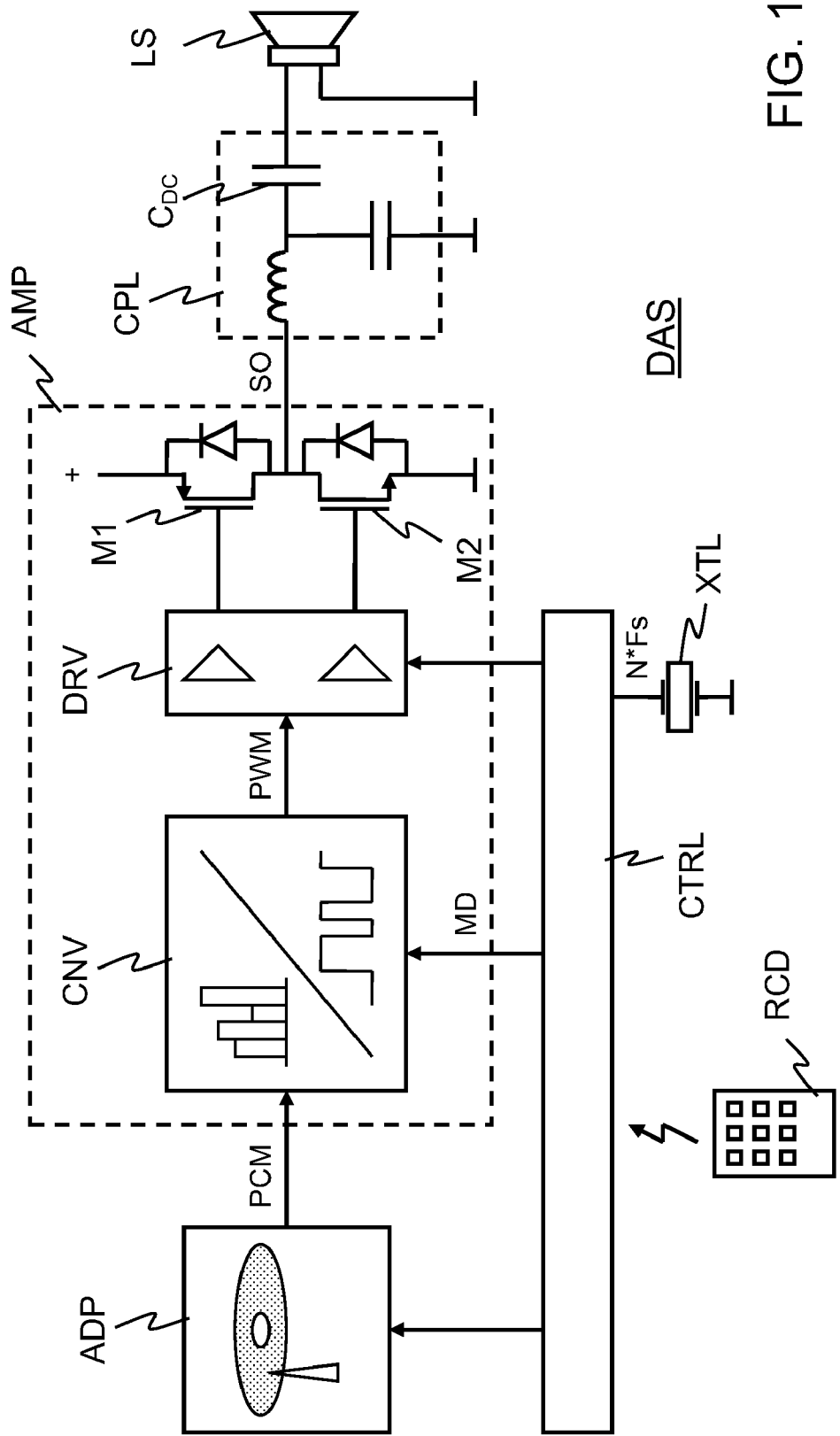
FIG. 1 is a block diagram that illustrates a digital audio system, which comprises a digital signal converter.

FIG. 1 illustrates a digital audio system DAS that includes a digital audio amplifier AMP. The digital audio amplifier AMP comprises a digital signal converter CNV, an output driver DRV, and two output transistors M1, M2. The two output transistors M1, M2 are coupled between a supply voltage node and a signal ground node. The two output transistors M1, M2 may be, for example, of the field effect type and provided with protecting diodes. A coupling network CPL couples the two output transistors M1, M2 to an electro-acoustic transducer LS, such as, for example, a loudspeaker or a headphone. The coupling network CPL comprises a DC blocking capacitance $C_{DC}$. The electro-acoustic transducer LS is coupled between the DC blocking capacitance $C_{DC}$ and the signal ground node.

The digital audio system DAS further comprises an audio data producer ADP, a controller CTRL, which is coupled to a crystal element XTL, and a remote-control device RCD. The audio data producer ADP may be in the form of, for example, a compact disk (CD) player, a solid-state memory, or a communication network interface. The controller CTRL may be in the form of a suitably programmed processor. The digital audio amplifier AMP may be implemented as a single integrated circuit, which may also include the controller CTRL.

The digital audio system DAS basically operates as follows. The audio data producer ADP provides a pulse code modulation signal PCM that represents audio information that is read from, for example, a CD. The pulse code modulation signal PCM is a stream of digital samples, which has a given sample rate. A digital sample represents audio signal amplitude by means of binary value, which comprises a given number of bits. For example, a digital sample from a CD typically comprises 16 bits. A stream of digital samples from a CD typically has a sample rate Fs of 44.1 kilohertz (kHz), which means that there are 44,100 samples per second. This sample rate will be referred to as CD sample rate hereinafter. The crystal element XTL provides a reference frequency that is N times the sample rate Fs, N being an integer number.

The digital signal converter CNV converts the pulse code modulation signal PCM, which the audio data producer ADP provides, into a pulse width modulated signal PWM. The pulse width modulated signal PWM is a binary signal that, at any given instant, has either a low value or a high value. Transitions from the low value to the high value, and vice versa, define pulses, which are of variable width. A transition from the low value to the high value, which is followed by another transition from the high value back to the low value, defines a positive pulse. Conversely, a transition from the high value to low value, which is followed by another transition from the low value back to the high value, defines a negative pulse.

The respective widths of positive pulses and negative pulses in the pulse width modulated signal PWM represent audio signal amplitude. For example, let it be assumed that positive pulses are extremely narrow compared with negative pulses during an interval of time. It can be said that the pulse width modulated signal PWM has a duty cycle of 0%. The pulse width modulated signal PWM represents a negative peak amplitude in that case. Conversely, let it now be assumed that negative pulses are extremely narrow compared with positive pulses during an interval of time. The duty cycle is 100% in that case. The pulse width modulated signal PWM represents a positive peak amplitude in that case. Positive pulses and negative pulses may also have an identical width, which means that the duty cycle is 50%. The pulse width modulated signal PWM represents zero amplitude in that case. An audio signal typically has an average amplitude that is zero. Accordingly, the pulse width modulated signal PWM has an average duty cycle that is 50%.

Positive and negative pulses alternately occur at an average rate that is substantially higher than a maximum audio frequency, which is typically 20 kHz. For example, positive and negative may alternately occur at an average rate that is 8 times the sample rate Fs of the pulse code modulation signal PCM. For example, the pulse code modulation signal PCM would have a frequency of 352.8 kHz if the pulse code modulation signal PCM has the CD sample rate.

The output driver DRV controls the two output transistors M1, M2 on the basis of the pulse width modulated signal PWM. The two output transistors M1, M2 behave as switches, which are either in an open state or in a closed state. Transistor M1 is in the closed state and transistor M2 is in the open state when the pulse width modulated signal PWM has the high level. The coupling network CPL receives a supply voltage (+) from the supply voltage node in that case. Conversely, transistor M2 is in the open state and transistor M1 is in the closed state when the pulse width modulated signal PWM has the low level. The coupling network CPL receives a signal ground voltage from the signal ground node in that case.

Accordingly, the coupling network CPL receives a binary power signal SO, which has a voltage that is either the supply voltage (+) or the signal ground voltage. The binary power signal SO is a high power representation of the pulse width modulated signal PWM. The binary power signal SO has a direct current component, which is substantially equal to one half of the supply voltage. This direct current component will be referred to as quiescent direct current output voltage hereinafter. The quiescent direct current output voltage corresponds with the average duty cycle of the pulse width modulated signal PWM, which is 50%.

The coupling network CPL filters high-frequency components that are present in the binary power signal SO. In doing so, the coupling network CPL effectively converts the binary power signal SO into an analog audio power signal, which drives the electro-acoustic transducer LS. The DC blocking capacitance $C_{DC}$ prevents that the quiescent direct current output voltage reaches the electro-acoustic transducer LS. The electro-acoustic transducer LS only receives an audio-frequency alternating current component that is present in the binary power signal SO. The audio-frequency alternating current component is superposed on the signal ground voltage, which the electro-acoustic transducer LS receives from the signal ground node. Accordingly, the quiescent direct current output voltage is present across the DC blocking capacitance $C_{DC}$.

A user may switch the digital audio amplifier AMP from a standby mode to an active mode, and vice versa, by means of, for example, the remote-control device RCD. To that end, the user may depress a power button on the remote-control device RCD, which signals this event to the controller CTRL. In response, the controller CTRL activates or deactivates, whichever is the case, the output driver DRV and the two output transistors M1, M2. The controller CTRL may activate and deactivate the power amplifier by, for example, applying the supply voltage to the aforementioned entities and by removing the supply voltage, respectively.

Let it be assumed that the user switches the digital audio amplifier AMP from the standby mode to the active mode. In the standby mode, substantially no voltage is present across the DC blocking capacitance $C_{DC}$. Once the digital audio amplifier AMP has operated in the active mode for a sufficiently long time, the quiescent direct current output voltage is present across the DC blocking capacitance $C_{DC}$, as explained hereinbefore. Consequently, the digital audio amplifier AMP needs to charge the DC blocking capacitance $C_{DC}$ upon switching from the standby mode to the active mode.

Charging the DC blocking capacitance $C_{DC}$ may produce transient noise in the form of an audible plop or click sound, which the electro-acoustic transducer LS produces. An audible plop or click sound may also occur upon switching the digital audio amplifier AMP from the active mode to the standby mode. In this case, the digital audio amplifier AMP needs to discharge the DC blocking capacitance $C_{DC}$ so as to bring the voltage across this capacitance from the quiescent direct current output voltage to zero.

The digital signal converter CNV has been specifically designed to prevent audible plop or click sounds, or any other transient noise, when switching from the standby mode to the active mode, or vice versa. The digital signal converter CNV can operate in three different modes: an audio mode, which has been described hereinbefore, a startup mode, and a shutdown mode. The controller CTRL provides a mode signal, which determines the mode in which the digital signal converter CNV operates. The controller CTRL causes the digital signal converter CNV to operate in the startup mode for a given interval of time, following a switch from the standby mode to the active mode. Subsequently, the controller CTRL causes the digital signal converter CNV to operate in the audio mode, assuming that no particular event has occurred of in the meantime. The controller CTRL causes the digital signal converter CNV to operate in the shutdown mode for a given interval of time, following a switch from the active mode to the standby mode.

In the startup mode, the digital signal converter CNV generates a specific pulse sequence, which forms part of the pulse width modulated signal PWM. This pulse sequence causes the digital audio amplifier AMP to charge the DC blocking capacitance $C_{DC}$ in a smooth fashion. This pulse sequence will therefore be referred to as charging pulse sequence hereinafter. The charging pulse sequence begins with relatively narrow positive pulses. This means that the charging pulse sequence has a front portion in which the duty cycle of the pulse width modulated signal PWM is nearly 0%. The charging pulse sequence ends with positive pulses and negative pulses having a substantially identical width. This means that the charging pulse sequence has a back portion in which the duty cycle is substantially 50%.

In the shutdown mode, the digital signal converter CNV generates a discharging pulse sequence, which causes the digital audio amplifier AMP to discharge the DC blocking capacitance $C_{DC}$ in a smooth fashion. The discharging pulse sequence is a mirrored version of the charging pulse sequence. That is, the discharging pulse sequence begins with positive pulses and negative pulses having a substantially identical width. There is a front portion in which the duty cycle is 50%. The discharging pulse sequence ends with relatively narrow positive pulses. There is a back portion in which the duty cycle is nearly 0%.

Importantly, the digital signal converter CNV is capable of providing relatively narrow positive pulses in a stable manner. That is, the digital signal converter CNV has a stable operation during the front portion of the charging pulse sequence and during the back portion of the discharging pulse sequence, notwithstanding the fact that the duty cycle is nearly 0% in these portions. The stable operation prevents transient noise, such as, for example, rushing noise, which might otherwise occur when the duty cycle is nearly 0%.

Figure 2:
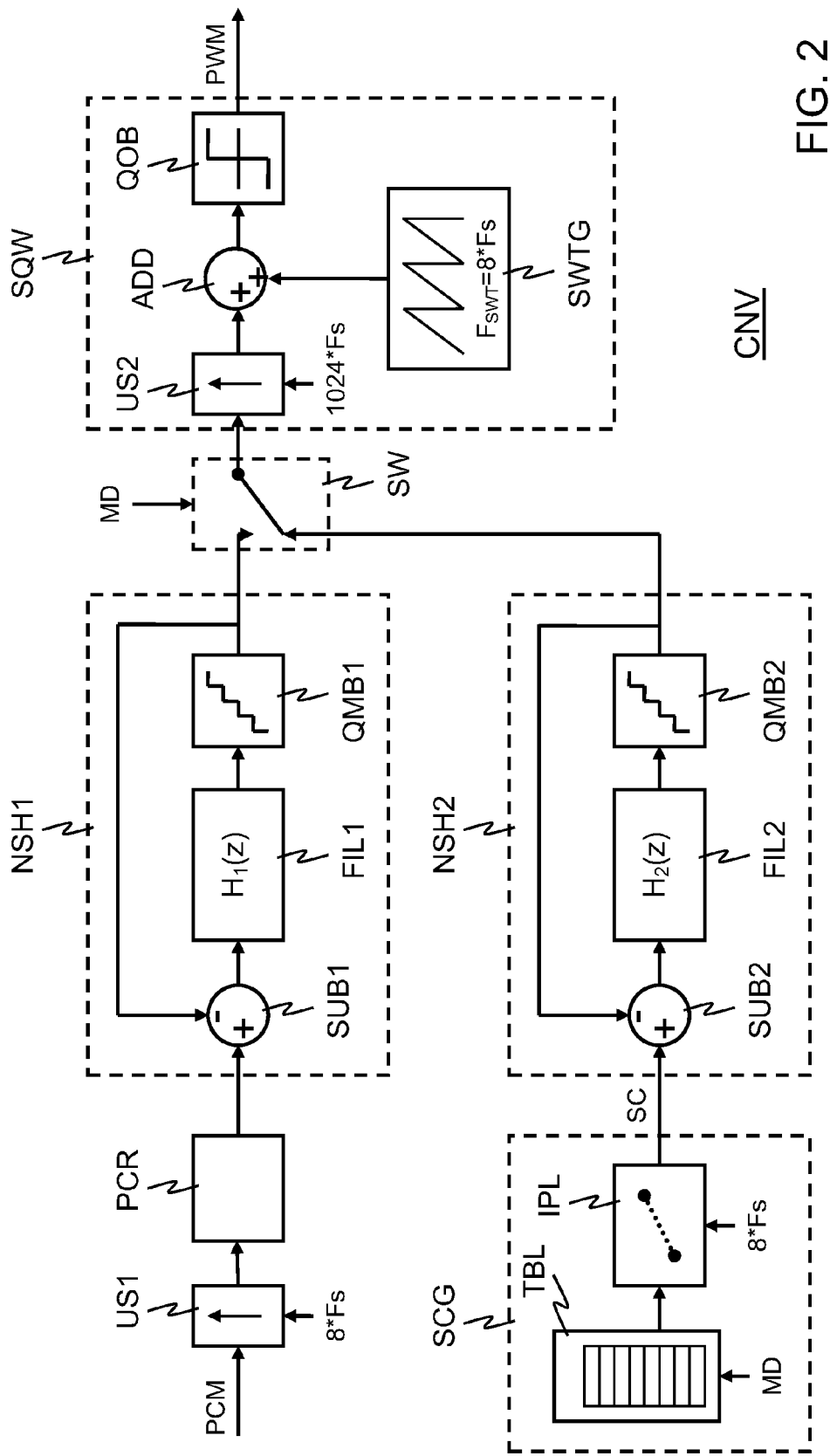
FIG. 2 is a functional diagram that illustrates the digital signal converter, which comprises an anti-transient noise shaping function.

FIG. 2 illustrates the digital signal converter CNV by means of a functional diagram. An upper portion illustrates a digital audio signal conversion path, which comprises the following functions: an up-sampling US1, a pre-correction PCR, a noise shaping NSH1, a switch SW, and a square wave generation SQW with variable duty cycle. The square-wave generation function SWQ with variable duty cycle comprises the following sub-functions: an up-sampling US2, a sawtooth generation SWTG, an addition ADD, and a one-bit quantization QOB.

A lower portion illustrates of FIG. 2 an anti-transient noise path, which comprises the following functions: an s-curve generation SCG, and a noise shaping NSH2. The s-curve generation function comprises the following sub-functions: a table lookup TBL and an interpolation IPL.

The noise shaping functions NSH1, NSH2 each comprise the following sub-functions: a subtraction SUB, a noise shaping filter FIL, and a multibit quantization MBQ. The noise shaping function NSH1 in the digital audio signal conversion path will be referred to as audio noise shaping function hereinafter. The noise shaping function NSH2 in the anti-transient noise path will be referred to as anti-transient noise shaping function NSH2 hereinafter.

Each of the aforementioned functions and sub-functions may be implemented by means of hardware or software, or a combination of hardware and software. For example, an implementation may comprise a dedicated circuit for each function. In another implementation, a single circuit may provide various functions. In yet another implementation, a software module in the form of, for example, a subroutine may provide one or more functions. Hybrid implementations, which involve hardware and software, are also possible.

As mentioned hereinbefore, the controller CTRL provides a mode control signal MD, which defines whether the digital signal converter CNV operates in the audio mode, the startup mode, or the shutdown mode. In the startup mode and in the shutdown mode, the switch function SW has a state as illustrated in FIG. 2. In this state, the switch function SW effectively blocks the digital audio signal conversion path. On the other hand, in this state, the switch function SW allows the anti-transient noise path to apply an input signal to the square-wave generation function SWQ with variable duty cycle. This will be described in greater detail hereinafter.

In the audio mode, the digital audio signal conversion path converts the pulse code modulation signal PCM into the pulse width modulated signal PWM, as described hereinbefore. More specifically, the up-sampling function US1 provides an up-sampled version of the pulse code modulation signal PCM. The up-sampled version has a sample rate Fs that is 8 times the sample rate Fs of the pulse code modulation signal PCM. The pre-correction function PCR, which is applied to the up-sampled version of the pulse code modulation signal PCM, compensate for any distortion that further processing may introduce. The pre-correction function PCR provides an input signal for the audio noise shaping function NSH1. In response, the audio noise shaping function NSH1 provides a noise-shaped digital audio signal which comprises 7-bit samples. The multibit quantization sub-function QMB1 in the audio noise shaping function NSH1 effectively reduces a 16-bit resolution, which the pulse code modulation signal PCM has, to a 7-bit resolution.

In the audio mode, the switch function SW passes the noise-shaped digital audio signal to the square-wave generation function SWQ with variable duty cycle. In the latter function, the up-sampling sub-function US2 provides an up-sampled version of the noise-shaped digital audio signal, which has a sample rate that is 1024 times the sample rate Fs of the pulse code modulation signal PCM. The sawtooth generation sub-function SWGT provides a digital sawtooth signal, which has a fundamental frequency $F_{SWT}$ that is 8 times the sample rate Fs of the pulse code modulation signal PCM. The addition sub-function ADD adds the up-sampled version of the noise-shaped digital audio signal to the digital sawtooth signal. This produces a dynamically amplitude-shifted sawtooth signal to which the one-bit quantization sub-function QOB is applied. The one-bit quantization sub-function QOB compares respective sample values in the dynamically amplitude-shifted sawtooth signal with a digital threshold value. The pulse width modulated signal PWM has the low value when a sample value is below the digital threshold value. Conversely, the pulse width modulated signal PWM has the high value when the sample value is above the digital threshold value.

In the startup mode, the s-curve generation function SCG generates a startup s-curve SC, which the anti-transient noise shaping function NSH2 receives. More specifically, the table lookup function TBL provides a sequence of samples, which are stored in a memory. The table lookup function TBL begins to read respective samples from the memory in a particular order when the mode control signal MD indicates that the startup mode applies. The interpolation function IPL generates interpolated samples between two samples that have been read from the memory. Accordingly, the startup s-curve SC can be precise without this requiring too much memory space.

Figure 3:
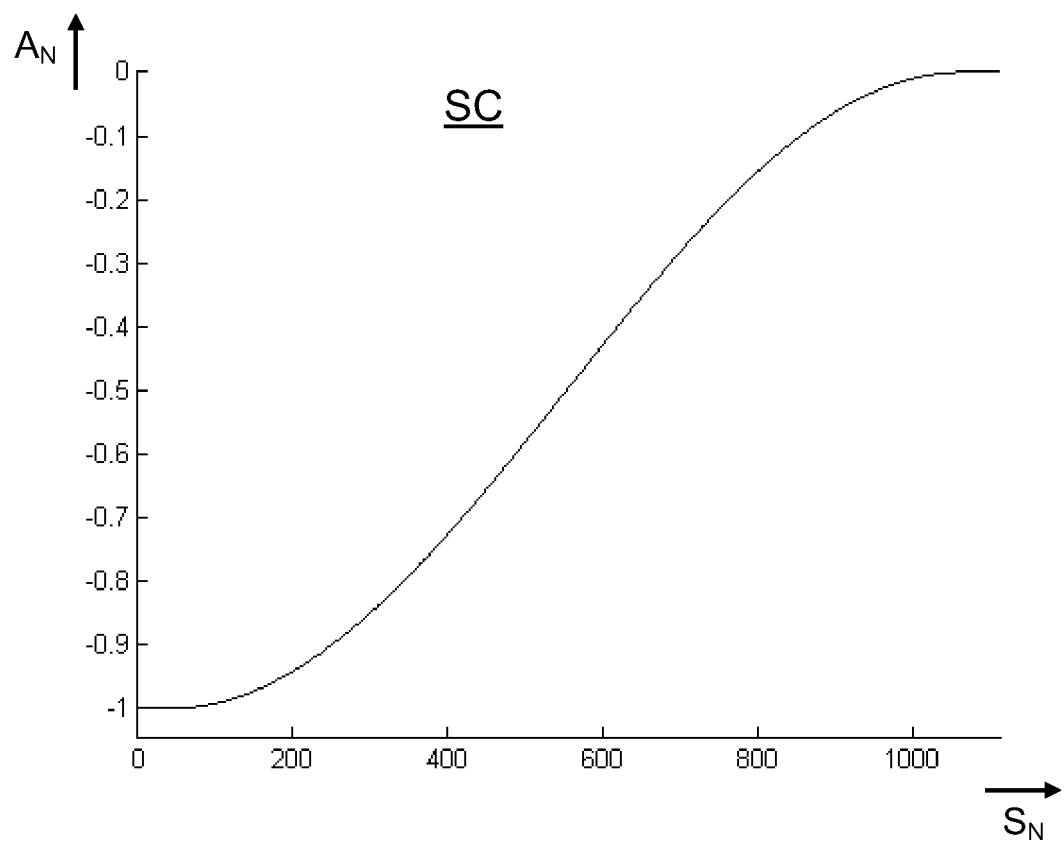
FIG. 3 is a signal diagram that illustrates a startup s-curve to which the anti-transient noise shaping function is applied.

FIG. 3 illustrates the startup s-curve SC. FIG. 3 is a graph with a horizontal axis, which represents sample numbers $S_N$, and a vertical axis, which represents a normalized amplitude $A_N$. The normalized amplitude −1 corresponds with the negative peak amplitude mentioned hereinbefore and the duty cycle being 0%. The normalized amplitude 0 corresponds with the zero amplitude mentioned hereinbefore and the duty cycle being 50%. The startup s-curve SC is a sequence of samples, which occurs in the interval of time that applies to the startup mode. The startup mode may last for, for example, 0.5 seconds. Within this interval of time, the startup s-curve SC causes the digital audio amplifier AMP to smoothly charge the DC blocking capacitance $C_{DC}$ without any substantial transient noise. The following characteristic contributes to this: the startup s-curve SC has a first derivative that is substantially equal to zero in a start portion and in an end portion of the curve.

In the shutdown mode, the s-curve generation generates a shutdown s-curve that is a mirror of the startup s-curve SC illustrated in FIG. 3. To that end, the table lookup function TBL may read respective samples from the memory in an inverse order with respect to the particular order that applies in the startup mode. The shutdown s-curve causes the digital audio amplifier AMP to smoothly discharge the DC blocking capacitance $C_{DC}$ without any substantial transient noise.

The anti-transient noise shaping function NSH2 has a stable operation throughout the startup s-curve SC illustrated in FIG. 3, even when the normalized amplitude is relatively close to −1. The same applies to the shutdown s-curve. Such stable operation can be achieved because the anti-transient noise shaping function NSH2 only has to process the startup s-curve SC and the shutdown s-curve, but not a digital audio signal. For example, let it be assumed that the startup s-curve SC illustrated in FIG. 3 is applied to the audio noise shaping function NSH1. It would be difficult, or even impossible, to implement this function in a manner that, on the one hand, allows stable operation throughout the startup s-curve SC and, on the other hand, allows distortion-free conversion of the pulse code modulation signal PCM into the pulse width modulated signal PWM. In the digital signal converter CNV illustrated in FIG. 2, the audio noise shaping function NSH1 focuses, as it were, on a distortion-free conversion and the anti-transient noise shaping function NSH2 focuses on a stable operation, even if the normalized amplitude is relatively close to −1.

Figure 4:
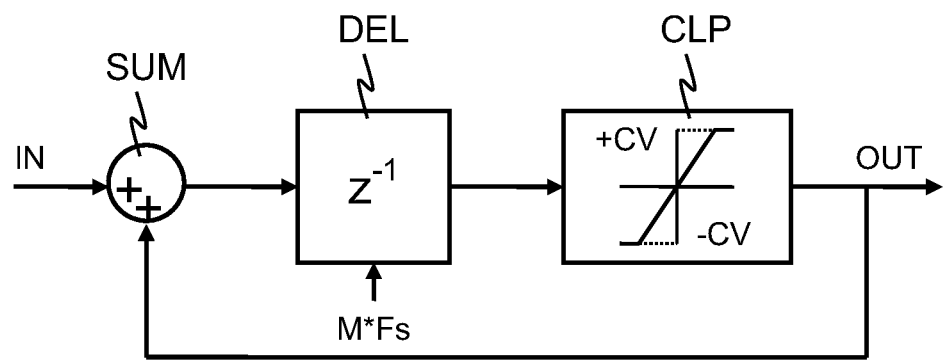
FIG. 4 is block diagram that illustrates a clipping integrator, which is a basic element of a noise shaping function.

FIG. 4 illustrates a clipping integrator ICL, which is a basic element of a noise shaping function. The clipping integrator ICL comprises a summer SUM, a delay module DEL, and a clipper CLP. The delay module DEL may be in the form of, for example, an array of flip-flops. The clipper CLP has a clipping value CV, which characterizes the clipper CLP. The clipping value CV defines a range of value comprised between a positive clipping value +CV and a negative clipping value −CV, which each have a magnitude corresponding with the clipping value CV.

The clipping integrator ICL receives a sequence of input samples IN at a given input sample rate Fs and, in response, provides a sequence of output samples OUT at an output sample rate, which may be a multiple of the given input sample rate Fs. The summer SUM adds an output sample to an input sample. This addition produces an integrated sample, which the delay module DEL stores for a given interval of time, which typically corresponds with the given input sample rate Fs. The delay module DEL may release, as it were, the integrated sample several times. This provides an up-sampling function. For example, the delay module DEL may release integrated samples at a rate that is M times the given input sample rate Fs, and being an integer number. The integer M represents the up sampling factor.

The clipper CLP clips the integrated sample in accordance with the clipping value CV. Accordingly, the clipper CLP provides a new output sample whose value corresponds with that of the integrated sample if the value of the integrated sample lies within the range of value, which the clipping value CV defines. The new output sample has the positive clipping value CV if the value of the integrated sample is greater than the positive clipping value CV. Conversely, the new output sample has the negative clipping value CV if the value of the integrated sample is smaller than the negative clipping value CV.

Figure 5:
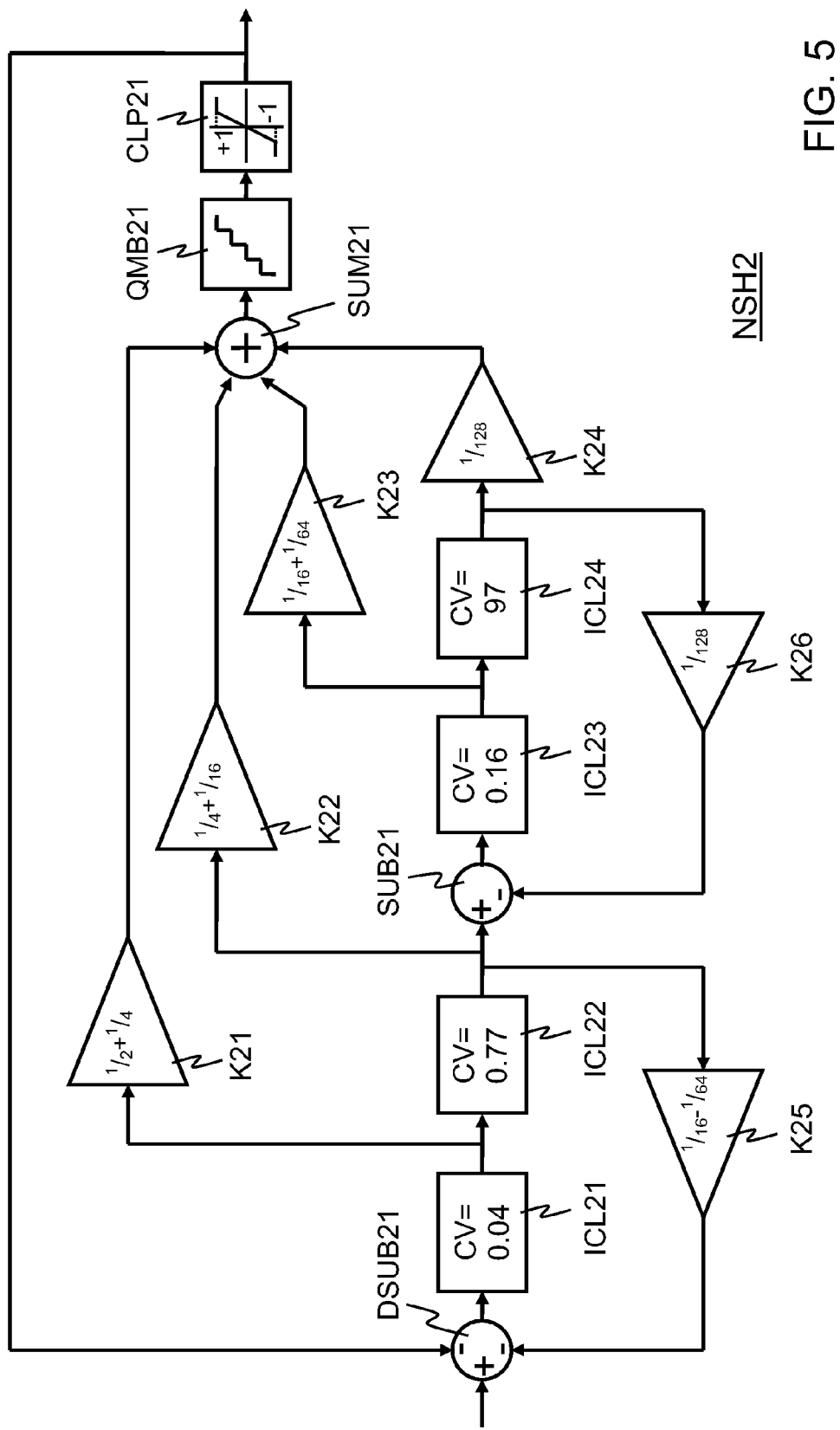
FIG. 5 is a block diagram that illustrates an implementation of the anti-transient noise shaping function within the digital signal converter.

FIG. 5 illustrates an implementation of the anti-transient noise shaping function NSH2, which will be referred to hereinafter as anti-transient noise shaping filter. The anti-transient noise shaping filter comprises four clipping integrators ICL1-ICL4 represented as rectangular boxes. Each clipping integrator is similar to the clipping integrator ICL illustrated in FIG. 4. Each clipping integrator has a specific clipping value CV, which is indicated inside the rectangular box that represents the clipping integrator ICL. Each clipping integrator may further provide an up-sampling function, as described hereinbefore with reference to FIG. 4.

The anti-transient noise shaping filter further comprises various scaling modules K21-K24 represented as triangles. Each scaling module scales an input sample with a scaling factor that is indicated inside the triangle that the scaling module represents. Each scaling factor is fraction of a power of two or a linear combination of respective fractions of a power of two. Accordingly, each scaling module can be implemented by means of the following basic operations: binary shifting, adding, and subtracting.

The anti-transient noise shaping filter further comprises a dual subtractor DSUB, which is present at an input, a subtractor SUB21, a summer SUM21, a multibit quantizer QMB21 and a clipper CLP21, which is present at an output. The multibit quantizer may provide, for example, 7-bit output samples. The clipping value CV of the clipper CLP21 is 1, which is a normalized magnitude.

The anti-transient noise shaping filter constitutes a closed loop system, which has a closed loop response that is nonlinear. This is due to the fact that each clipping integrator has a specific clipping value CV, which is a finite number. The clipper within a particular clipping integrator may clip at a given instant, depending on characteristics of an input signal that the anti-transient noise shaping filter receives. A clipping integrator may be regarded as an open circuit when the clipper in that clipping integrator clips. This has an impact on the closed loop response. The closed loop response thus depends on the characteristics of the input signal. Whether or not the anti-transition noise shaping filter has a stable operation depends on the closed loop response.

A stable operation can be achieved by appropriately setting respective clipping values for a given input signal. The respective clipping values that FIG. 5 illustrates allow the anti-transient noise shaping filter to process the startup s-curve SC illustrated in FIG. 3 in a stable fashion. The same applies to the shutdown s-curve, which is a mirrored version startup s-curve SC. The following characteristic contributes to the stable operation. The clipping value of clipping integrator ICL21, which is 0.04, is an order of magnitude lower than the clipping value of clipping integrator ICL22, which is 0.77. Similarly, the clipping value of clipping integrator ICL23, which is 0.16, is an order of magnitude lower than the clipping value of clipping integrator ICL24, which is 97. That is, the respective clipping values cover a relatively wide range of several orders of magnitude.

Appropriate clipping values may empirically be found by means of, for example, running various computer simulations for different sets of clipping values. There may be many different sets of clipping values, which are appropriate for a particular implementation. Moreover, appropriate clipping values may vary from one implementation to another, depending on the particular filter structure and the respective scaling factors of a given implementation, which equally define the closed loop response.

CONCLUDING REMARKS

The detailed description hereinbefore with reference to the drawings is merely an illustration of the invention and the additional features, which are defined in the claims. The invention can be implemented in numerous different manners. In order to illustrate this, some alternatives are briefly indicated.

The invention may be applied to advantage in any type of product or method involves conversion of a digital input signal into a pulse width modulated signal. The digital audio system DAS illustrated in FIG. 1 is merely an example. The invention may equally be applied to advantage in, for example, a digital video system that comprises a digital signal converter, which receives a digital input signal that represents video information. That is, the digital input signal that the digital signal converter receives need not necessarily represent audio information. The digital input signal may represent any type of information, including control information.

It should further be noted that the invention can be applied to advantage in various different types of circuits. An amplifier is merely an example. The invention may equally be applied in, for example, digital-to-analog converters with noise shapers. Such circuits equally produce a pulse width modulated signal. The invention allows the pulse width modulated signal to smoothly arrive at a quiescent direct current component, or to smoothly depart from the quiescent direct current component, without any particular stability problems. Numerous applications can benefit from this.

There are numerous different manners of implementing a digital signal converter in accordance with the invention. The digital signal converter CNV illustrated in FIG. 2 is merely an example. This digital signal converter has an architecture, which is often referred to as uniform pulse width modulation generation. More specifically, the digital signal converter CNV illustrated in FIG. 2 is a specific variant of this architecture, wherein noise shaping and square wave generation are separate functions. In another variant, these functions may be combined. Referring to FIG. 2, separate noise shaping filters may provide the respective noise shaping functions NSH1, NSH2. Alternatively, a single reconfigurable noise shaping filter may provide both these noise shaping functions. Other variants and architectures exist. The article entitled "A Review and Comparison of Pulse Width Modulation (PWM) methods for Analog and Digital input Switching Power Amplifiers" by Karsten Nielsen, presented at the 102nd AES Convention. March 1997. Munich, Germany, gives an overview of various digital signal conversion architectures (AES is an acronym for Audio Engineering Society).

There are numerous different manners of generating a suitable direct current modification signal. FIG. 2 merely illustrates an example which involves a table lookup function TBL and an interpolation function IPL. As another example, a dedicated logic circuit may generate a specific sequence of samples that constitutes a suitable direct current modification signal. It should further be noted that the startup s-curve SC illustrated in FIG. 3 is merely an example of a suitable transient curve. There are numerous different shapes that allow transient noise reduction. Moreover, it should be noted that a quiescent direct current voltage need not necessarily correspond with 50% duty cycle. Other duty cycles are possible, which may require a transient curve to have a start value or an end value, which is different from those illustrated in FIG. 3.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A digital signal converter for converting a digital input signal into a pulse width modulated signal, the digital signal converter being arranged to operate in a transition mode wherein the digital converter provides the pulse width modulated signal by applying an anti-transient noise shaping function to a direct current modification signal, and in a signal mode wherein the digital signal converter provides the pulse width modulated signal by applying a signal noise shaping function to a digital input signal.

2. A digital signal converter according to claim 1, the signal noise shaping function forming part of a signal conversion path, which further comprises a switch and a square wave generator with variable duty cycle, the switch being arranged to pass output samples from the signal noise shaping function to the square wave generator in the signal mode, and to pass output samples from the anti-transient noise shaping function in the transition mode.

3. A digital signal converter according to claim 1 comprising a transient curve generator arranged to provide the direct current modification signal in the form of a startup curve, which causes the pulse width modulated signal to comprise a sequence of positive pulses of gradually increasing width.

4. A digital signal converter according to claim 1 comprising a transient curve generator arranged to provide the direct current modification signal in the form of a shutdown curve, which causes the pulse width modulated signal to comprise a sequence of positive pulses of gradually decreasing width.

5. A digital signal converter according to claim 1 comprising a transient curve generator arranged to provide the direct current modification signal in the form of a curve, which has a first derivative that is substantially equal to zero in a start portion and in an end portion of the curve.

6. A digital signal converter according claim 3, the transient curve generator comprising an interpolator for providing interpolated samples between respective samples, which are read from a memory.

7. A digital signal converter according to claim 1 comprising a noise shaping filter, which provides the anti-transient noise shaping function, the noise shaping filter comprising various clipping integrators with respective clipping values, a clipping integrator providing output samples whose respective magnitudes are clipped to the clipping value of the clipping integrator.

8. A digital signal converter according to claim 7, the clipping value (0.04) of one clipping integrator being at least in order of magnitude lower than the clipping value (0.77) of another clipping integrator.

9. A switching amplifier comprising a digital signal converter according to claim 1, and an output stage for providing a power signal, which is an amplified version of the pulse width modulated signal from the digital signal converter.

10. A digital audio system comprising an audio data producer arranged to provide a digital input signal, which represents audio information, and a switching amplifier according to claim 9 coupled between the audio data producer and an electro-acoustic transducer.

11. A method of converting a digital input signal into a pulse width modulated signal, the method comprising:
 a transition step in the pulse width modulated signal is provided by applying an anti-transient noise shaping function to a direct current modification signal; and
 a signal provision step in which the pulse width modulated signal is provided by applying an signal noise shaping function to the digital input signal.

12. The method of claim 11, wherein the signal noise shaping function forming part of a signal conversion path, the method further comprising:

passing output samples from the signal noise shaping function to a square wave generator with variable duty cycle using a switch in the signal mode; and passing output samples from the anti-transient noise shaping function using the switch in the transition mode.

13. The method of claim 11 further comprising providing the direct current modification signal in the form of a startup curve, which causes the pulse width modulated signal to comprise a sequence of positive pulses of gradually increasing width.

14. The method of claim 11 further comprising providing the direct current modification signal in the form of a shutdown curve, which causes the pulse width modulated signal to comprise a sequence of positive pulses of gradually decreasing width.

15. The method of claim 11 further comprising providing the direct current modification signal in the form of a curve, which has a first derivative that is substantially equal to zero in a start portion and in an end portion of the curve.

16. The method of claim 13, wherein providing the direct current modification signal in the form of the startup curve comprises providing interpolated samples between respective samples, which are read from a memory.

* * * * *